United States Patent
Awata

(10) Patent No.: US 8,222,935 B2
(45) Date of Patent: Jul. 17, 2012

(54) COMMUNICATION SYSTEM, PHASE-LOCKED LOOP, MOVABLE BODY AND COMMUNICATION METHOD

(75) Inventor: Hideki Awata, Kanagawa (JP)

(73) Assignee: Sony Corporation, Tokyo (JP)

( * ) Notice: Subject to any disclaimer, the term of this patent is extended or adjusted under 35 U.S.C. 154(b) by 237 days.

(21) Appl. No.: 12/713,798

(22) Filed: Feb. 26, 2010

(65) Prior Publication Data
US 2010/0253402 A1 Oct. 7, 2010

(30) Foreign Application Priority Data
Apr. 1, 2009 (JP) ................................ 2009-089395

(51) Int. Cl.
*H03L 7/06* (2006.01)
(52) U.S. Cl. ....................... 327/156; 327/147
(58) Field of Classification Search .................. 327/147, 327/158, 156
See application file for complete search history.

(56) References Cited

U.S. PATENT DOCUMENTS

| | | | | |
|---|---|---|---|---|
| 7,277,519 B2 * | 10/2007 | Raha et al. | ..................... | 375/376 |
| 7,298,221 B2 * | 11/2007 | Yan | ................. | 331/17 |
| 2001/0050579 A1 | 12/2001 | Han | | |
| 2005/0117680 A1 * | 6/2005 | Raha et al. | ..................... | 375/376 |
| 2008/0069252 A1 * | 3/2008 | Wenzhen et al. | .............. | 375/260 |
| 2010/0097152 A1 * | 4/2010 | Wang et al. | ...................... | 331/44 |
| 2010/0099372 A1 * | 4/2010 | Wang et al. | ..................... | 455/313 |
| 2010/0253402 A1 * | 10/2010 | Awata | ........................... | 327/156 |
| 2011/0187425 A1 * | 8/2011 | Mika et al. | ..................... | 327/157 |
| 2011/0193741 A1 * | 8/2011 | Kumar | ..................... | 342/357.25 |

FOREIGN PATENT DOCUMENTS

WO    WO 99/50685    10/1999

OTHER PUBLICATIONS

Wei-Lung Mao, et al., "A New Fuzzy Bandwidth Carrier Recovery System in GPS for Robust Phase Tracking", IEEE Signal Processing Letters, vol. 11, No. 4, XP011109415, Apr. 1, 2004, pp. 431-434.

* cited by examiner

*Primary Examiner* — Lincoln Donovan
*Assistant Examiner* — Adam Houston
(74) *Attorney, Agent, or Firm* — Oblon, Spivak, McClelland, Maier & Neustadt, L.L.P.

(57) ABSTRACT

A communication system includes a phase-locked loop that maintains synchronization of a reception signal. The phase-locked loop includes a loop filter that has a circuit configuration m for an m-th order phase-locked loop including a circuit configuration n for an n-th order phase-locked loop (m>n), and a switching section that switches circuit configurations, which are activated in the loop filter, between the circuit configuration n and the circuit configuration m.

6 Claims, 11 Drawing Sheets

COMMUNICATION SYSTEM, PHASE-LOCKED LOOP, MOVABLE BODY AND COMMUNICATION METHOD

BACKGROUND OF THE INVENTION

1. Field of the Invention

The present invention relates to a communication system, a phase-locked loop, a movable body, and a communication method.

2. Description of the Related Art

In recent years, a GPS (Global Positioning System) receiver receiving a navigation message transmitted from an artificial satellite and calculating the current position thereof has been widely used by being applied to mobile telephones, car navigation systems, and the like.

Specifically, the navigation message transmitted from the artificial satellite contains orbit information indicating the orbit of the artificial satellite, and information such as transmission time of a signal. The GPS receiver receives navigation messages from four or more artificial satellites, and calculates the position of each artificial satellite from the orbit information contained in the navigation message. The GPS receiver then calculates the current three-dimensional position through a simultaneous equation on the basis of the position of each artificial satellite and the difference in the transmission time and the reception time of the navigation message. In addition, the navigation messages transmitted from the four or more artificial satellites are desired when calculating the three-dimensional position. The reason is that an error exists between the clock incorporated the GPS receiver and an atomic clock provided in the artificial satellite.

Further, each artificial satellite spreads the spectrum of data of 50 bps by using a signal termed a L1-band C/A code, that is, a pseudo-random (PRN: Pseudo-Random Noise) code, of which the code length is 1,023 and the chip rate is 1.023 MHz, and transmits the navigation message on the basis of a signal in which a carrier of 1,575.42 MHz is BPSK (Binary Phase Shift Keying) modulated by using the spread spectrum signal.

Accordingly, when the GPS receiver is intended to receive the signal transmitted from the artificial satellite, it is necessary to synchronize the PRN code, the carrier, and the data. In order to synchronize the carrier of the reception signal, a phase-locked loop (PLL: Phase-Locked Loop) is used in general GPS receivers.

The PLL has different performance in synchronization holding, that is, tracking in accordance with the loop order. For example, in the second-order PLL, phase errors occur under the condition of accelerated motion (its tracking ability under acceleration is low), but its loop stability is high (it has high resistance to noise). On the other hand, in the third-order PLL, its tracking ability under acceleration is high, but its loop stability is lower than that of the second-order PLL (it has low resistance to noise). Furthermore, international patent publication No. 99/50685 discloses an electronic navigation apparatus that includes a plurality of PLLs of different orders so as to determine parameters such as acceleration on the basis of outputs from the plurality of PLLs.

SUMMARY OF THE INVENTION

As described above, since advantages of the second-order PLL and the third-order PLL are different, it is preferable that the PLLs should be selectively used as the situation demands. However, similarly to the electronic navigation apparatus disclosed in international patent publication No. 99/50685, when the plurality of PLLs of different orders is separately provided, a problem arises in that the size of the circuit increases.

Accordingly, the invention has been made in view of the above-mentioned problem, and it is desirable to provide a new and improved communication system capable of changing the order of the phase-locked loop while suppressing an increase in size of the circuit. In addition, it is also desirable to provide a phase-locked loop, a movable body, and a communication method therefor.

In order to solve the above-mentioned problem, according to an embodiment of the invention, there is provided a communication system including a phase-locked loop that maintains synchronization of a reception signal. The phase-locked loop includes a loop filter that has a circuit configuration m for an m-th order phase-locked loop including a circuit configuration n for an n-th order phase-locked loop (m>n), and a switching section that switches circuit configurations, which are activated in the loop filter, between the circuit configuration n and the circuit configuration m.

In this case, it is preferable that the communication system should further include a control section that controls the switching section to switch the circuit configurations in response to change in a current state of the communication system.

In this case, it is preferable that the control section should compare a threshold value with a value which is obtained on the basis of signal intensity measurement of the reception signal, should control the switching section to switch the circuit configurations, which are activated in the loop filter, from the circuit configuration n to the circuit configuration m when the value is equal to or greater than the threshold value, and should control the switching section to switch the circuit configurations, which are activated in the loop filter, from the circuit configuration m to the circuit configuration n when the value is less than the threshold value.

In this case, it is preferable that the control section should periodically compare the threshold value with the value which is obtained on the basis of the signal intensity measurement of the reception signal.

In this case, it is preferable that the control section the control section should compare a threshold value with a value which is obtained on the basis of acceleration measurement of the communication system, should control the switching section to switch the circuit configurations, which are activated in the loop filter, from the circuit configuration m to the circuit configuration n when the value is equal to or greater than the threshold value, and should control the switching section to switch the circuit configurations, which are activated in the loop filter, from the circuit configuration n to the circuit configuration m when the value is less than the threshold value.

In this case, it is preferable that the control section should periodically compare the threshold value with the value which is obtained on the basis of the acceleration measurement of the communication system.

Further, in order to solve the above-mentioned problem, according to another embodiment of the invention, there is provided a phase-locked loop including: a loop filter that has a circuit configuration m for an m-th order phase-locked loop including a circuit configuration n for an n-th order phase-locked loop (m>n); and a switching section that switches circuit configurations, which are activated in the loop filter, between the circuit configuration n and the circuit configuration m.

Furthermore, in order to solve the above-mentioned problem, according to a further embodiment of the invention, there is provided a movable body equipped with a communication system including a phase-locked loop that maintains synchronization of a reception signal. The phase-locked loop includes a loop filter that has a circuit configuration m for an m-th order phase-locked loop including a circuit configuration n for an n-th order phase-locked loop (m>n), and a switching section that switches circuit configurations, which are activated in the loop filter, between the circuit configuration n and the circuit configuration m.

Further, in order to solve the above-mentioned problem, according to a still further embodiment of the invention, there is provided a communication method in a loop filter that is included in a phase-locked loop for maintaining synchronization of a reception signal and has a circuit configuration m for an m-th order phase-locked loop including a circuit configuration n for an n-th order phase-locked loop (m>n). The method includes a step of switching circuit configurations, which are activated, between the circuit configuration n and the circuit configuration m.

As described above, by using the communication system, the phase-locked loop, the movable body and the communication method according to the embodiments of the invention, it is possible to change the order of the phase-locked loop while suppressing an increase in size of the circuit.

DESCRIPTION OF THE PREFERRED EMBODIMENTS

Figure 1:
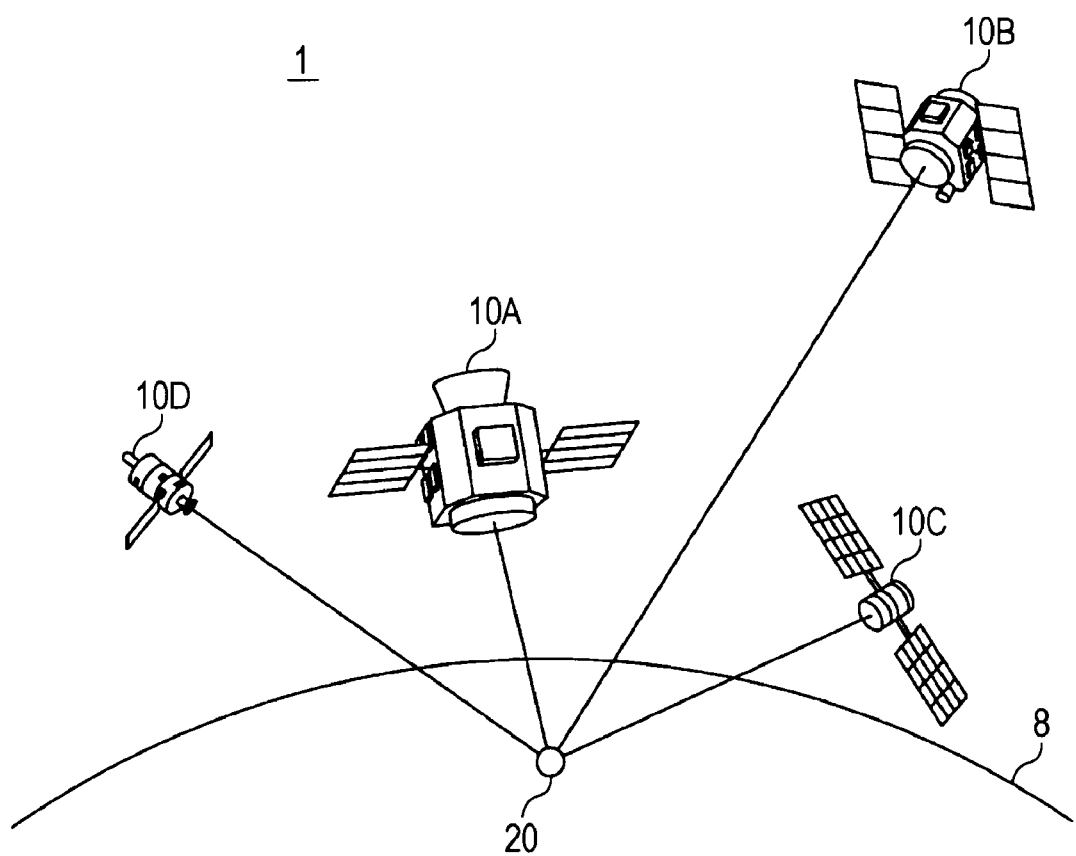
FIG. 1 is an explanatory diagram illustrating a configuration of an artificial satellite system according to an embodiment of the invention.

Hereinafter, preferred embodiments of the invention will be described in detail with reference to the appended drawings. In this specification and the appended drawings, components that have the same function and configuration in practice are denoted with the same reference signs and numerals, and repeated explanation of these components is omitted.

Further, in this specification and the appended drawings, a plurality of components that has the same function and configuration in practice is distinguished by different signs added to the tail of the same reference signs and numerals. For example, the plurality of components that has the same function and configuration in practice is distinguished like artificial satellites 10A, 10B and 10C as necessary. However, in a case where it is not particularly necessary to distinguish the plurality of components that have the same function and configuration in practice, those are denoted with only the same reference numerals and signs. For example, in a case where it is not particularly necessary to distinguish the artificial satellite 10A, 10B and 10C, those are simply referred to as the artificial satellites 10.

The "DETAILED DESCRIPTION OF THE PREFERRED EMBODIMENTS" will be described in the order of items indicated below.

1. Brief Overview of Artificial Satellite System
   1-1. Brief Overview of Position Measurement Based on GPS
   1-2. Configuration of Navigation Message
   1-3. Configuration and Operation of Receiver
   1-4. Configuration of Synchronization Holding Section
   2. Background
   3. Configuration of Loop Filter according to Embodiments of the Invention
   4. Control Method of Loop Filter
   4-1. First Example
   4-2. Second Example
   5. Conclusion 1. Brief Overview of Artificial Satellite System First, an artificial satellite system 1 according to the embodiment of the invention will be described with reference to FIGS. 1 to 6.

1-1. Brief Overview of Position Measurement Based on GPS

FIG. 1 is an explanatory diagram illustrating a configuration of the artificial satellite system 1 according to the embodiment. As shown in FIG. 1, the artificial satellite system 1 includes a plurality of artificial satellites 10A to 10D, and a receiver 20.

The artificial satellites 10 (GPS satellites) constitute a measurement satellite system (GNSS: Global Navigation Satellite System), and orbits above the Earth 8. Only four artificial satellites 10A to 10D are shown in FIG. 1, but for example a total of 24 artificial satellites, four on each of six orbital planes, orbit above the Earth 8.

The artificial satellite 10 transmits a navigation message (details are described in "1-2. Configuration of Navigation Message") including ephemeris information and almanac information, which are orbit information of the artificial satellite, TOW (Time Of Week) representing a transmission time of the navigation message, and the like. The artificial satellite 10 is provided with an atomic clock, and the transmission time is expressed, for example, in units of 6 seconds in accordance with the atomic clock provided in the artificial satellite 10.

In addition the artificial satellite 10 transmits the navigation message by using a spread spectrum signal termed a L1-band C/A code. The spread spectrum signal is a signal in which the spectrum of data of 50 bps is spread out by a pseudo-random series spreading code (hereinafter, referred to as a PRN code) and a carrier of 1,575.42 MHz is BPSK-modulated by using the spread spectrum signal. Further, the PRN code has a code length of 1,023 and a chip rate of 1.023 MHz.

The receiver 20 on the Earth 8 is able to calculate the current position of the apparatus itself on the basis of the received navigation message by receiving the navigation message which is transmitted from the artificial satellites 10A to 10D.

More specifically, the receiver 20 acquires the ephemeris information from the navigation message by receiving the navigation message transmitted from the artificial satellites 10A to 10D. The receiver 20 then calculates the positions of the artificial satellites 10A to 10D from the ephemeris information. The receiver 20 also calculates the distance between the artificial satellites 10A to 10D and the receiver 20 from the difference in the transmission time contained in the ephemeris information and the reception time of the navigation message. Thereafter, the receiver 20 uses the respective calculated positions of the artificial satellites 10A to 10D, and the distance between each artificial satellite 10A to 10D and the receiver 20 so as to calculate an equation having the current three-dimensional position of the receiver 20 as an unknown.

The navigation messages transmitted from the four or more artificial satellites 10 are necessary when calculating the current three-dimensional position of the receiver 20 in such a manner. The reason is that an error exists between the clock (RTC: Real Time Clock) incorporated in the receiver 20 and the atomic clock provided in the artificial satellite 10.

The artificial satellite 10 updates the ephemeris information at a predetermined period, and transmits the navigation message containing the updated ephemeris information. Since the artificial satellite 10 is constantly moving, the error between the position of the artificial satellite 10 calculated on the basis of the ephemeris information and the actual position of the artificial satellite 10 becomes larger with the passage of time from the update of the ephemeris information. Hence, the time of validity of about two hours is set in the ephemeris information which is contained in the navigation message.

The position measurement based on the GPS has been schematically described with reference to FIG. 1. In FIG. 1, the receiver 20 is indicated by a circle as one example of an information processing apparatus. However, the receiver 20 may be an information processing apparatus such as a PC (a Personal Computer), a home video processing device (a DVD recorder, a video cassette recorder, and the like), a mobile telephone, a PHS (a Personal Handyphone System), a portable music reproduction device, a portable video processing device, a PDA (a Personal Digital Assistant), a home game machine, a portable game machine, home electronics, an in-vehicle apparatus, and the like.

Further, the receiver 20 may be mounted on a movable body which is movable with persons and goods loaded therein. For example, a movable body includes automobiles such as a two-wheeled vehicle and various vehicles such as a three-wheeled vehicle, and a bicycle, a bus, an electric train, a Shinkansen, a street car, an airplane, a ship, and a boat.

1-2. Configuration of Navigation Message

Next, the configuration of the navigation message, which is transmitted from the artificial satellite 10, will be described with reference to FIG. 2.

Figure 2:
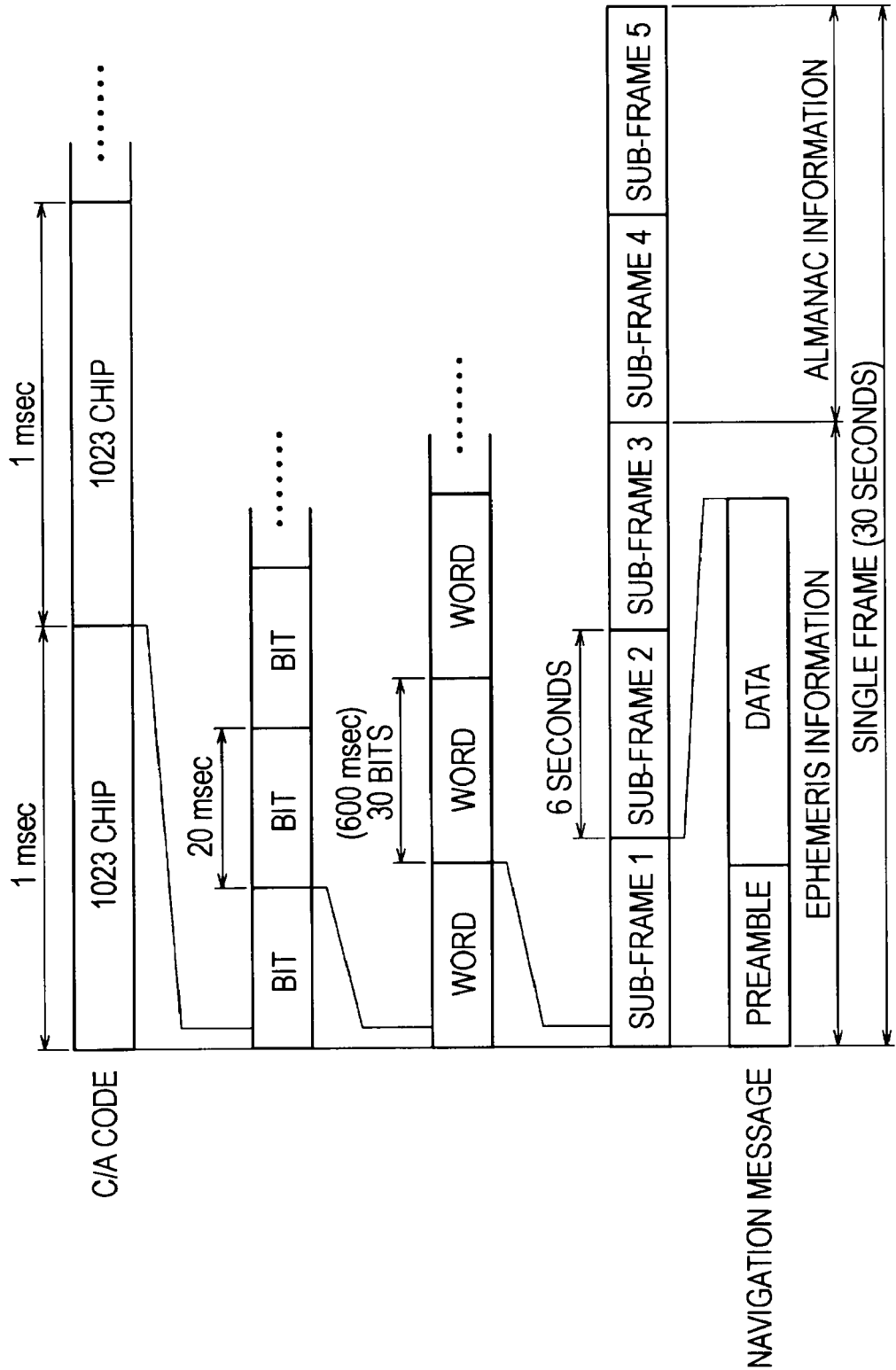
FIG. 2 is an explanatory diagram illustrating a frame configuration of a navigation message.

FIG. 2 is an explanatory diagram illustrating a frame configuration of the navigation message. As shown in FIG. 2, a single frame of the navigation message includes five sub-frames. The length of the single frame is 30 seconds, and has an amount of information of 1500 bits. Each sub-frame includes transmission time TOW of the navigation message. Further, the first sub-frame 1 to third sub-frame 3 contains the ephemeris information on parameters for calculating factors such as a long radius of the orbit, an eccentricity, a mean anomaly, a longitude of ascending node, an argument of perigee, and an angle of orbit inclination. On the other hand, the fourth sub-frame 4 and fifth sub-frame 5 contain almanac information common to all the artificial satellites 10. The almanac information includes information on the six factors of all the artificial satellites 10, information as to which artificial satellite 10 is available, and the like.

Further, each sub-frame contains data following a preamble which is a fixed pattern. Each sub-frame includes ten words. The length of each sub-frame is six seconds, and has an amount of information of 300 bits.

Further, each word includes 30 bits, and the length thereof is 600 msec. Further, the length of each bit is 20 msec corresponding to 20 periods of the C/A code (the spreading code). Accordingly, the transmission rate of the data is 50 bps. Further, as shown in FIG. 2, a single period of the C/A code is 1 msec, and the code includes 1023 chips of the PRN code.

1-3. Configuration and Operation of Receiver

Figure 3:
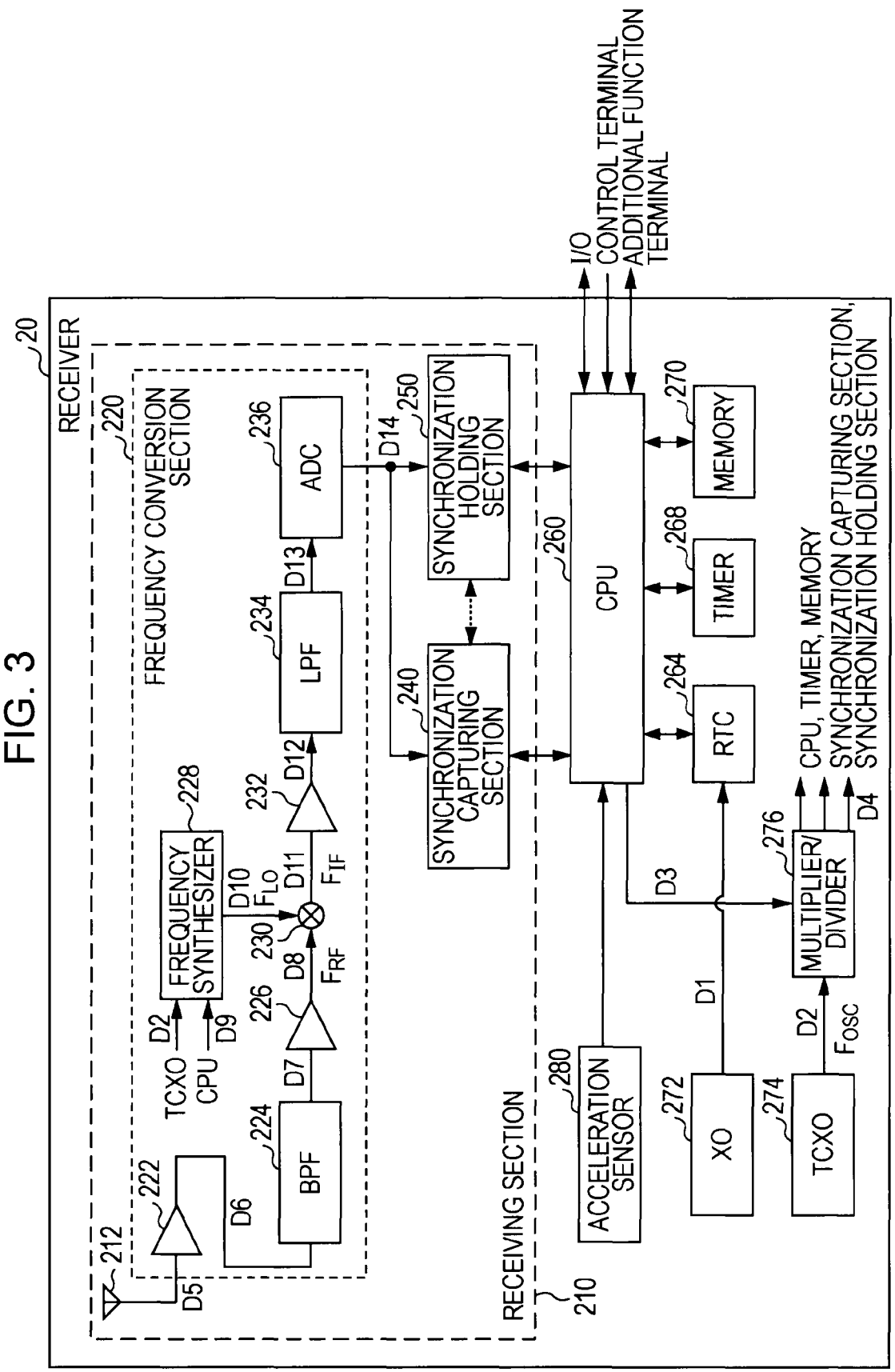
FIG. 3 is an explanatory diagram illustrating a hardware configuration of a receiver according to the embodiment of the invention.

FIG. 3 is an explanatory diagram illustrating a hardware configuration of the receiver 20 according to the embodiment. As shown in FIG. 3, the receiver 20 includes: a receiving section 210 having an antenna 212, a frequency converting section 220, a synchronization capturing section 240, and a synchronization holding section 250; a CPU (Central Processing Unit) 260; an RTC (Real Time Clock) 264; a timer 268; a memory 270; an XO (X'tal Oscillator) 272; a TCXO (Temperature Compensated X'tal Oscillator) 274; a multiplier/divider 276; and an acceleration sensor 280.

The XO 272 oscillates a signal D1 having a predetermined frequency (for example, about 32.768 kHz), and provides the oscillated signal D1 to the RTC 264. The TCXO 274 oscillates a signal D2 having a frequency (for example, about 16.368 MHz) different from the XO 272, and provides the oscillated signal D2 to the multiplier/divider 276 or a frequency synthesizer 228.

The multiplier/divider 276 performs multiplication, division, or both on the signal D2 provided from the TCXO 274 on the basis of an instruction from the CPU 260. The multiplier/divider 276 provides the signal D4 performed with multiplication, division, or both to the frequency synthesizer 228 of the frequency converting section 220, the CPU 260, the timer 268, the memory 270, the synchronization capturing section 240, and the synchronization holding section 250.

The antenna 212 receives a radio signal (for example, an RF signal in which a carrier of 1575.42 MHz is spread out) such as the navigation message which is transmitted from the artificial satellite 10, converts the radio signal to an electric signal D5, and provides the electric signal D5 to the frequency converting section 220.

The frequency converting section 220 includes an LNA (Low Noise Amplifier) 222, a BPF (Band Pass Filter) 224, an amplifier 226, a frequency synthesizer 228, a multiplier 230, an amplifier 232, an LPF (Low Pass Filter) 234, and an ADC (Analog Digital Converter) 236. As described below, the frequency conversion section 220 down-converts the signal D5 having a high frequency of 1575.42 MHz received by the antenna 212 into the signal D14 having a frequency of, for example, about 1.023 MHz in order to facilitate the digital signal processing.

The LNA 222 amplifies the signal D5 provided from the antenna 212, and provides the same to the BPF 224. The BPF 224 including a SAW filter (Surface Acoustic Wave Filter) extracts only a specific frequency component of the frequency components of the signal D6 amplified by the LNA, and provides the same to the amplifier 226. The amplifier 226 amplifies the signal D7 (a frequency $F_{RF}$) having the frequency component extracted by the BPF 224, and provides the same to the multiplier 230.

The frequency synthesizer 228 generates a signal D10 having the frequency $F_{LO}$ on the basis of the instruction D9 from the CPU 260 by using the signal D2 provided from the TCXO 274. The frequency synthesizer 228 provides the generated signal D10 having the frequency $F_{LO}$ to the multiplier 230.

The multiplier 230 multiples the signal D8 having the frequency $F_{RF}$ provided from the amplifier 226 and the signal D10 having the frequency $F_{LO}$ provided from the frequency synthesizer 228. That is, the multiplier 230 down-converts the high frequency signal into the IF (Intermediate Frequency) signal D11 (for example, an intermediate frequency signal having a frequency of about 1.023 MHz).

The amplifier 232 amplifies the IF signal D11 down-converted by the multiplier 230, and provides the same to the LPF 234.

The LPF 234 extracts the low frequency component of the frequency components of the IF signal D12 amplified by the amplifier 232, and provides the signal D13 having the extracted low frequency component to the ADC 236. FIG. 3 shows an example in which the LPF 234 is disposed between the amplifier 232 and the ADC 236, but the BPF may be disposed between the amplifier 232 and the ADC 236.

The ADC 236 converts the IF signal D13 of analog format provided from the LPF 234 to digital format, and provides the IF signal D14, which is converted to the digital format, to the synchronization capturing section 240 and the synchronization holding section 250.

The synchronization capturing section 240 performs synchronization capturing of the PRN code of the IF signal D14, which is provided from the ADC 236, by using the signal D4, which is provided from the multiplier/divider 276, on the basis of the control by the CPU 260, and detects the carrier frequency of the IF signal D14. In the synchronization capturing, for example, an optional configuration such as a sliding correlator or a matched filter may be used. Then, the synchronization capturing section 240 provides the phase of the PRN code, the carrier frequency of the IF signal D14, and the like to the synchronization holding section 250 and the CPU 260.

The synchronization holding section 250 performs synchronization holding of the PRN code and the carrier of the IF signal D14, which is provided from the ADC 236, by using the signal D4, which is provided from the multiplier/divider 276, on the basis of the control by the CPU 260. More specifically, the synchronization holding section 250 operates with the phase of the PRN code, the carrier frequency of the IF signal D14, and the like provided from the synchronization capturing section 240 as initial values. The synchronization holding section 250 demodulates the navigation message contained in the IF signal D14 which is provided from the ADC 236, and provides the same to the CPU 260.

The CPU 260 calculates the position and speed of each artificial satellite 10 on the basis of the navigation message which is provided from the synchronization holding section 250, and calculates the position of the receiver 20. The CPU 260 corrects the time information of the RTC 264 on the basis of the navigation message, or performs various controls in connection with a control terminal, an I/O terminal, and an added function terminal. Furthermore, the CPU 260 according to the embodiment of the invention functions as a control section for controlling the loop order of the PLL 254 of the synchronization holding section 250.

The RTC 264 measures a time by using the signal D1 having the predetermined frequency provided from the XO 272. The time measured by the RTC 264 is appropriately corrected by the CPU 260.

The timer 268 keeps time by using the signal D4 which is provided from the multiplier/divider 276. Such timer 268 is referenced when determining the start timing of various controls performed by the CPU 260. For example, the CPU 260 references the timer 268 when determining the start timing of the operation of the PRN code generator of the synchronization holding section 250 on the basis of the PRN code which is captured by the synchronization capturing section 240.

The memory 270 includes a RAM (Random Access Memory), a ROM (Read-Only Memory) and the like, and functions as a working space of the CPU 260, a storage section of a program, a storage section of the navigation message, and the like. In the memory 270, the RAM is used as a working area for performing various processes performed by the CPU 260 and the like. Further, the RAM is employed for buffering various data and for holding the ephemeris and almanac information as the orbit information of the artificial satellite 10 obtained from the synchronization holding section 250, intermediate data generated in the process of calculation, and result data of the calculation. Further, in the memory 270, the ROM is used as a section for storing various programs, fixed data, and the like. Furthermore, in the memory 270, the nonvolatile memory may be used as a section for storing the ephemeris and almanac information as the orbit information of the artificial satellite 10, the position information of the position measurement result, an error amount of the TCXO 12, and the like, even when the power of the receiver 20 is off.

The acceleration sensor 280 measures the acceleration of the receiver 20. The acceleration of the receiver 20 measured by the acceleration sensor 280 is provided to the CPU 260.

In addition, a configuration excluding the XO 272, the TCXO 274, the antenna 212, the LNA 222, and the BPF 224 from the configuration of the receiver 20 shown in FIG. 3 can be made on an integrated circuit formed as a single chip.

Subsequently, an operation example of the above-mentioned receiver 20 will be described with reference to FIG. 4.

Figure 4:
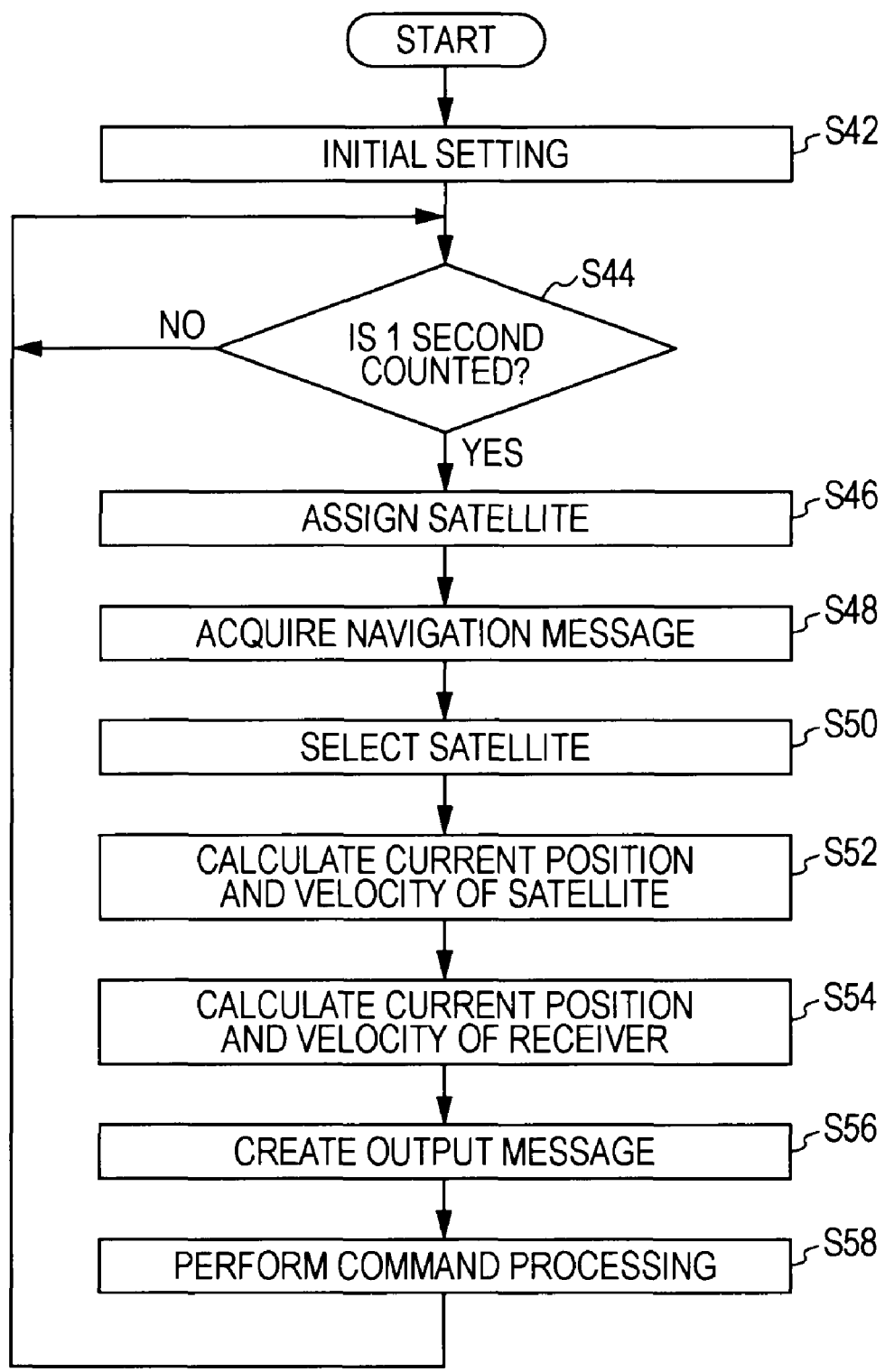
FIG. 4 is a flowchart illustrating a flow of an operation example of the receiver according to the embodiment of the invention.

FIG. 4 is a flowchart illustrating the flow of the operation example of the receiver 20 according to the embodiment of the invention. As shown in FIG. 4, when the receiver 20 is activated, the CPU 260 performs an initial setting (S42). Subsequently, when one second is counted by the RTC 264 (S44), the CPU 260 allocates the artificial satellite 10 to each channel (S46).

Thereafter, when the navigation message is acquired by the receiving section 210 (S48), the CPU 260 selects at least four or more artificial satellites 10 to be actually used in position measurement calculation from the artificial satellites in which the synchronization holding is being performed (S50). Then, the CPU 260 calculates the current position and the speed of the selected artificial satellite 10 (S52), and calculates the current position and the speed of the receiver 20 on the basis of the calculated current position and the speed of the artificial satellite 10 (S54).

Subsequently, the CPU 260 creates an output message representing the calculated current position and the speed of the receiver 20 (S56), and executes command processing corresponding to the output message, and the flow then returns to the processing of S44 (S58).

1-4. Configuration of Synchronization Holding Section

Next, the configuration of the synchronization holding section 250 will be described with reference to FIGS. 5 and 6.

Figure 5:
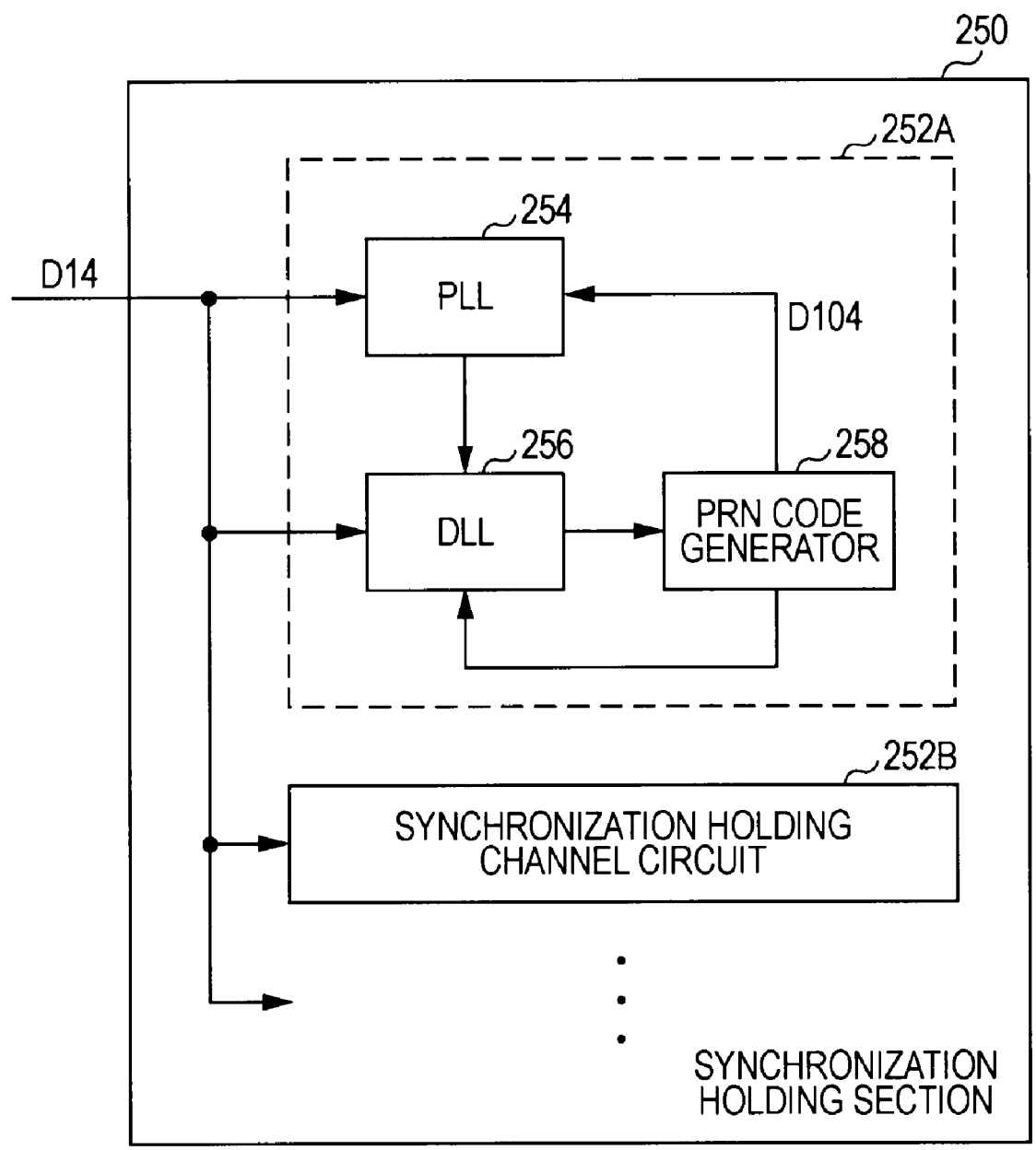
FIG. 5 is an explanatory diagram illustrating a configuration of a synchronization holding section.

FIG. 5 is an explanatory diagram illustrating the configuration of the synchronization holding section 250. As shown in FIG. 5, the synchronization holding section 250 includes a plurality of synchronization holding channel circuits 252A, 252B. Here, each synchronization holding channel circuit 252 performs the processing of the radio signal transmitted from the artificial satellite 10 of the satellite system 1. Thus, the synchronization holding section 250 including the plurality of synchronization holding channel circuits 252A, 252B . . . is able to perform parallel processing on radio signals which are transmitted from the plurality of artificial satellites 10.

Further, the synchronization holding channel circuit 252 includes a PLL (Phase-Locked Loop) 254, a DLL (Delay-locked Loop) 256, and a PRN code generator 258.

The PLL 254 performs the synchronization holding of the carrier of the IF signal D14 of the radio signal transmitted from the artificial satellite 10 of the satellite system 1, and outputs the carrier frequency of the artificial satellite 10 which is being tracked. The obtained carrier frequency is provided to the DLL 256, and is used in the position measurement. Further, the PLL 254 also extracts the navigation message, and the extracted navigation message is provided to the CPU 260.

The DLL 256 performs the synchronization holding of the PRN code of the IF signal D14 of the radio signal transmitted from the artificial satellite 10 of the satellite system 1, and outputs the phase and the frequency of the PRN code of the artificial satellite 10 which is being tracked. The obtained PRN code phase is provided to the PLL 254, and is used in the position measurement. Further, the PRN code frequency obtained by the DLL 256 is provided to the PRN code generator 258.

The PRN code generator 258 generates the PRN code corresponding to the PRN code frequency obtained by the DLL 256. The type of the PRN code generated by the PRN code generator 258 is designated by the CPU 260 in accordance with the type of the artificial satellite 10 to be subjected to the synchronization holding.

Figure 6:
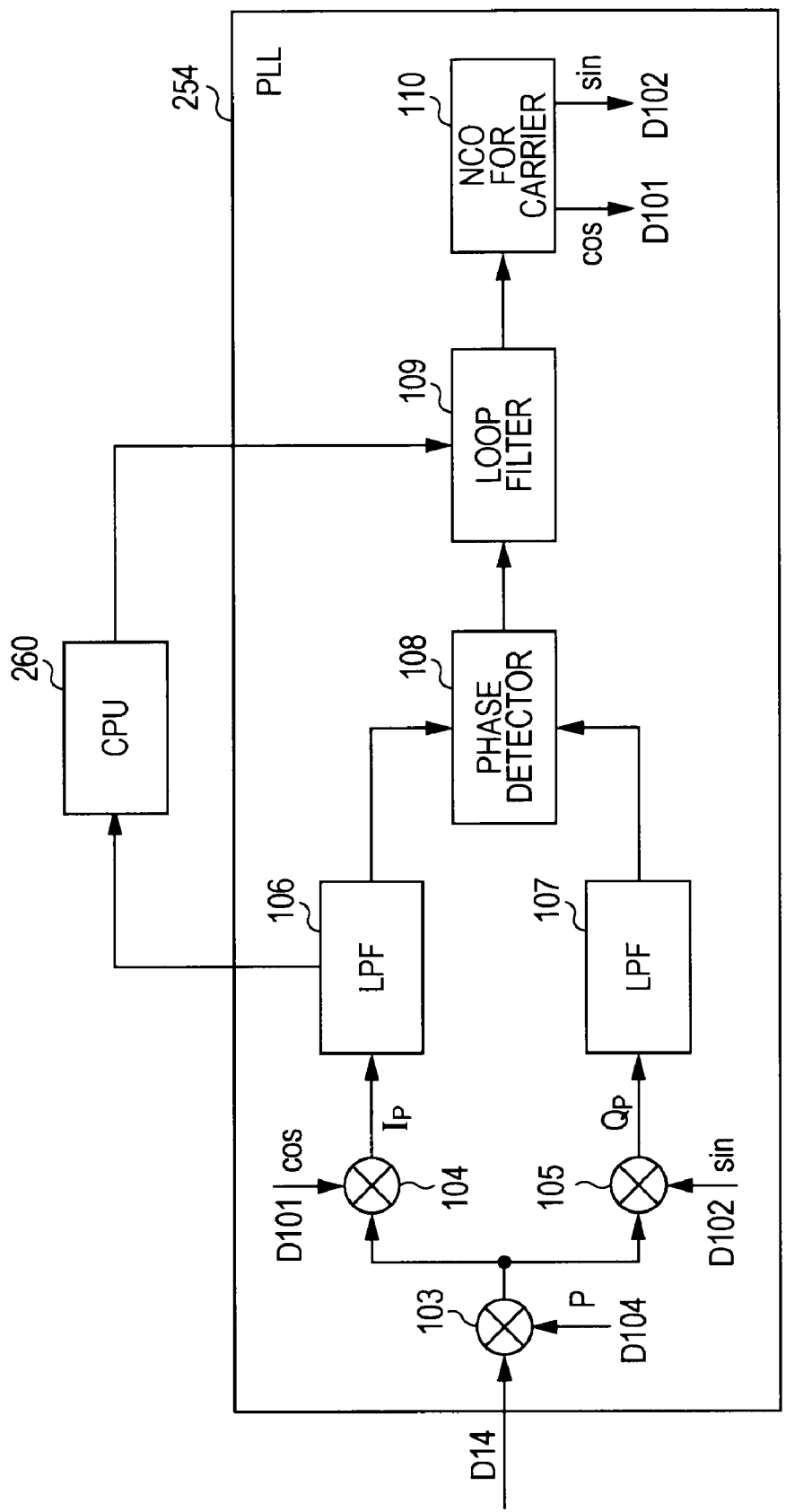
FIG. 6 is an explanatory diagram illustrating a detailed configuration of PLL.

FIG. 6 is an explanatory diagram illustrating a detailed configuration of the PLL 254. As shown in FIG. 6, the PLL 254 includes mixers 103, 104, and 105, LPFs 106 and 107, a phase detector 108, a loop filter 109, and an NCO 110.

The mixer 103 multiplies a no-delay (Prompt or Punctual) signal of the PRN code, which is output from the PRN code generator 258, by the IF signal D14 provided from the ADC 236, and despreads the PRN code of the designated artificial satellite 10 included in the IF signal D14. The signal, which is despread by the mixer 103, is provided to the mixers 104 and 105.

The mixer 104 multiplies the output of the mixer 103 and the cos component of the output of the NCO 110, thereby extracting an I component of the carrier of the radio signal in the process of tracking. The I component includes, as a frequency component, the sum and difference of the carrier frequency of the radio signal being in the process of tracking and the frequency of the carrier generated by the NCO 110. Further, the I component extracted by the mixer 104 is provided to the LPF 106.

The mixer 105 multiplies the output of the mixer 103 and the sin component of the output of the NCO 110, thereby extracting a Q component of the carrier of the radio signal in the process of tracking from the output of the mixer 103. The Q component includes, as a frequency component, the sum and difference of the carrier frequency of the radio signal being in the process of tracking and the frequency of the carrier generated by the NCO 110. Further, the Q component extracted by the mixer 105 is provided to the LPF 107.

The LPF 106 extracts the frequency component of the difference from the frequency component of the sum and difference of the frequencies of the carrier generated by the NCO 110 and the radio signal included in the output of the mixer 104. The frequency component extracted by the LPF 106 is provided to the phase detector 108.

Likewise, the LPF 107 extracts the frequency component of the different from the frequency component of the sum and difference of the frequencies of the carrier generated by the NCO 110 and the radio signal included in the output of the mixer 105. The frequency component extracted by the LPF 107 is provided to the phase detector 108. Furthermore, the LPFs 106 and 107 also have a function of removing out-of-band noise.

The phase detector 108 detects the phase difference between the carrier of the radio signal being in the process of tracking and the carrier generated by the NCO 110 on the basis of the outputs of the LPFs 106 and 107. The phase difference information representing the phase difference detected by the phase detector 108 is provided to the loop filter 109.

The loop filter 109 is an LPF for removing undesirable noise from the phase difference information and achieving desirable response of loop. The output of the loop filter 109 is provided to the NCO 110. Furthermore, a parameter specifying the response of loop in the loop filter 109 is acquired from the CPU 260.

The NCO 110 generates a carrier signal corresponding to the frequency based on the input. The NCO 110 generates a reference carrier signal D101 and a signal D102 with a phase lag of 90 degrees. The carrier signal D101 generated by the NCO 110 is provided to the mixer 104, and the carrier signal D102 is provided to the mixer 105.

2. Background

As described above, the synchronization holding section 250 includes the PLL 254 for performing the synchronization holding of the carrier of the radio signal which is transmitted from the artificial satellite 10, and characteristics of the PLL 254 depend on the loop filter 109. Hereinafter, a circuit configuration of a loop filter for a second-order PLL and a circuit configuration of a loop filter for a third-order PLL will be described with reference to FIGS. 7 and 8.

Figure 7:
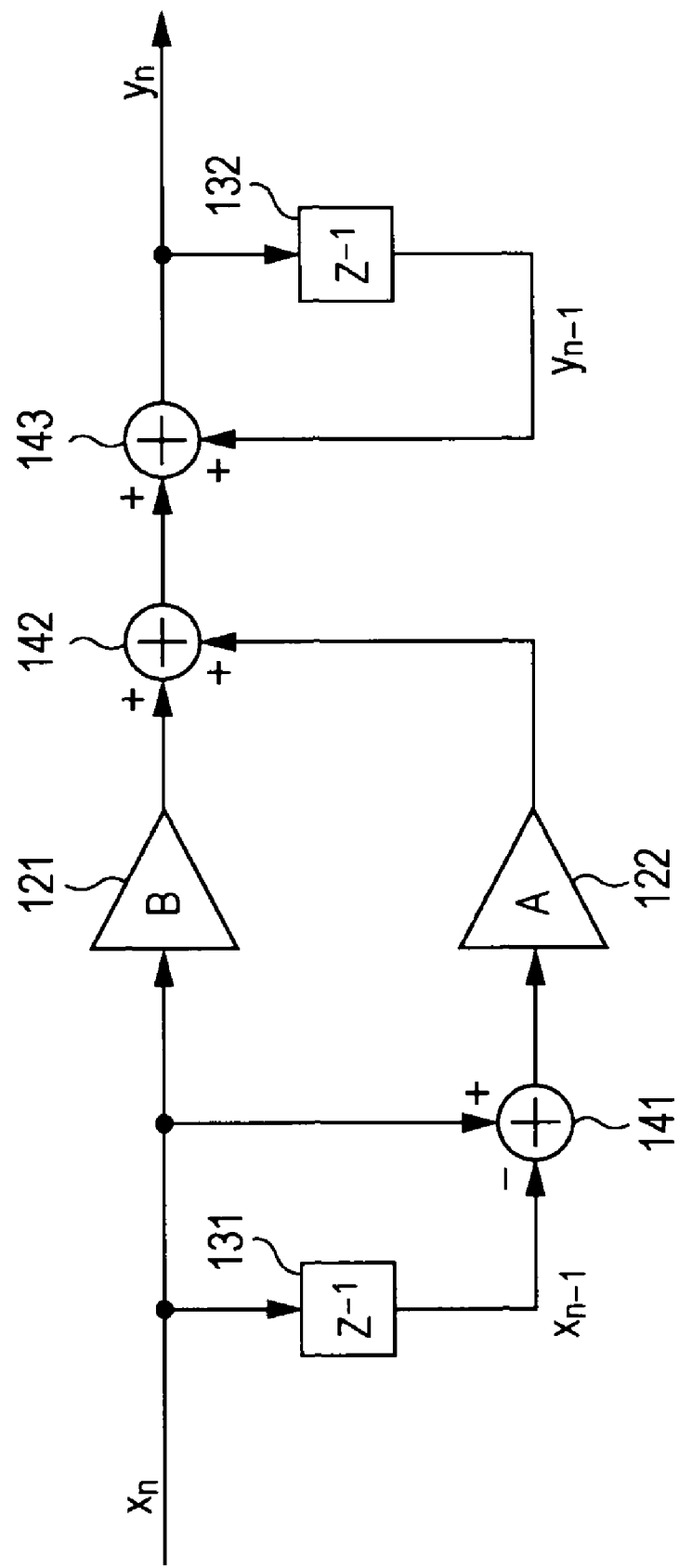
FIG. 7 is an explanatory diagram illustrating an example of a circuit configuration of a loop filter for a second-order PLL.

FIG. 7 is an explanatory diagram illustrating an example of the circuit configuration of the loop filter for the second-order PLL. As shown in FIG. 7, the circuit configuration of the loop filter for the second-order PLL includes delay elements 131 and 132, adders 141 to 143, and multipliers 121 and 122. Further, the multiplier 121 multiplies the input by B, and the multiplier 122 multiplies the input by A. The loop filter for the second-order PLL having such a circuit configuration is expressed by the following differential equation of Numerical Expression 1.

$$y_n = y_{n-1} + A\Delta x_n + Bx_n$$

$$(\Delta x_n = x_n - x_{n-1}) \hspace{2cm} \text{Numerical Expression 1}$$

Here, the latest output from the phase detector 108 is defined as the input $x_n$, and the previous output from the phase detector 108 is defined as the input $x_{n-1}$. Further, the latest output from the loop filter shown in FIG. 7 is defined as the output $y_n$, and the previous output from the loop filter shown in FIG. 7 is defined as the output $y_{n-1}$. Further, the A and B are coefficients multiplied by the multiplier 122 and multiplier 121, and are parameters for determining characteristics of the PLL.

Figure 8:
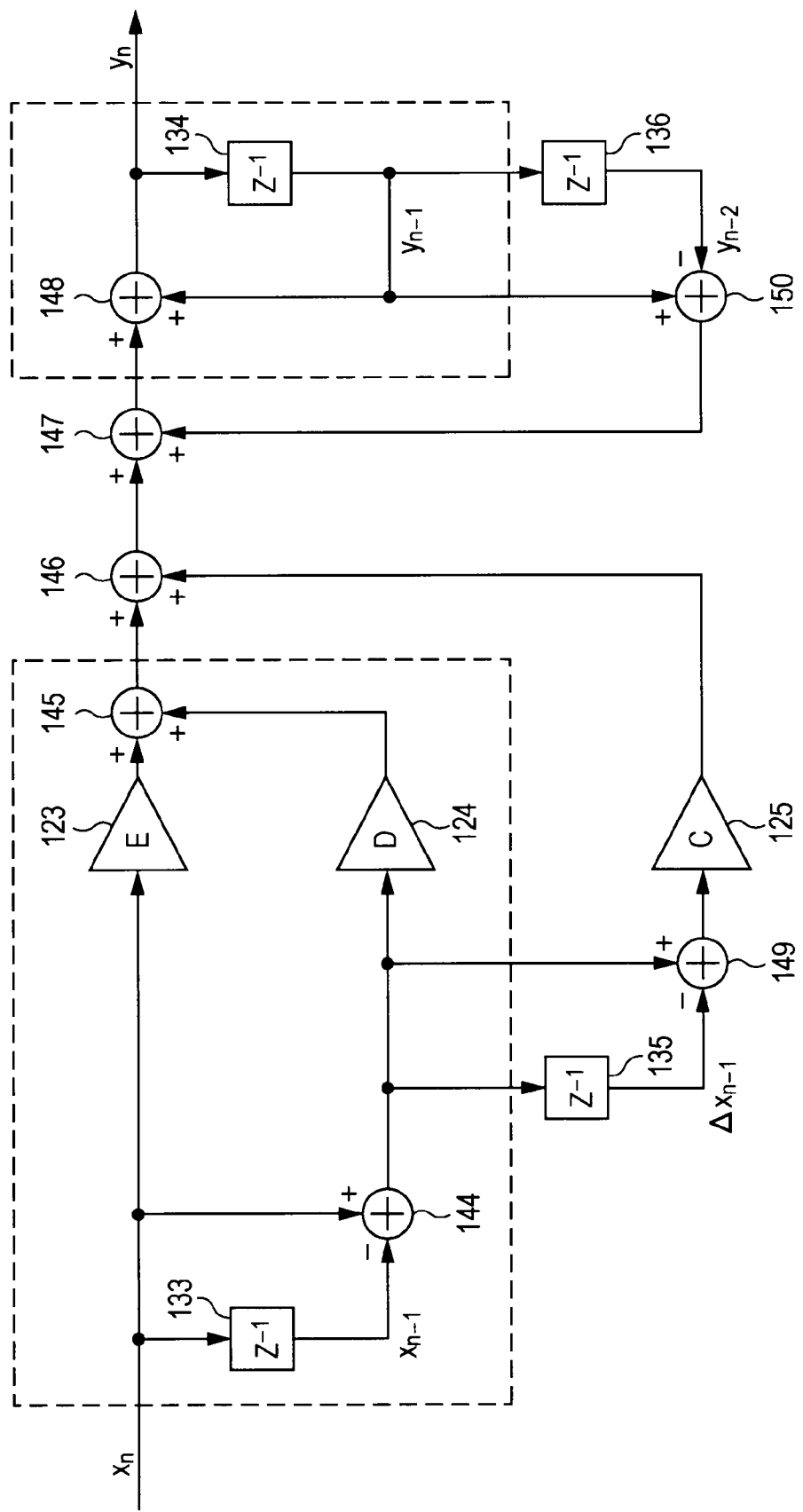
FIG. 8 is an explanatory diagram illustrating an example of a circuit configuration of a loop filter for a third-order PLL.

FIG. 8 is an explanatory diagram illustrating an example of the circuit configuration of the loop filter for the third-order PLL. As shown in FIG. 8, the circuit configuration of the loop filter for the third-order PLL includes delay elements 133 to 136, adders 144 to 150, and multipliers 123 to 125. Further, the multiplier 123 multiplies the input by E, the multiplier 124 multiplies the input by D, and the multiplier 125 multiplies the input by C. The loop filter for the third-order PLL having such a circuit configuration is expressed by the following differential equation of Numerical Expression 2.

$$y_n = y_{n-1} + \Delta y_{n-1} + C\delta x_n + D\Delta x_n + Ex_n \quad \text{Numerical Expression 2}$$

where $\Delta y_{n-1} = y_{n-1} - y_{n-2}$ $$\delta x_n = \Delta x_n - \Delta x_{n-1} = (x_n - x_{n-1}) - (x_{n-1} - x_{n-2})$$

Here, in the second-order PLL, phase errors occur under the condition of accelerated motion (its tracking ability under acceleration is low), but its loop stability is high (it has high resistance to noise). On the other hand, in the third-order PLL, its tracking ability under acceleration is high, but its loop stability is lower than that of the second-order PLL (it has low resistance to noise).

As described above, since advantages of the second-order PLL and the third-order PLL are different, it is preferable that the PLLs should be selectively used as the situation demands. However, when the circuit configuration of the loop filter for the second-order PLL and the circuit configuration of the loop filter for the third-order PLL are separately provided, a problem arises in that the size of the circuit increases.

For this reason, in consideration of the above-mentioned situation, the PLL 254 according to the embodiment of the invention has been made. By using the PLL 254 according to the embodiment of the invention, it is possible to change the order of the loop while suppressing an increase in size of the circuit. In the following explanation, the loop filter 109 for embodying the PLL 254 will be described in detail.

3. Configuration of Loop Filter according to Embodiments of the Invention

As can be seen from FIGS. 7 and 8, the circuit configuration of the loop filter for the third-order PLL includes the circuit configuration of the loop filter for the second-order PLL. More specifically, the circuit configuration in the area enclosed by the dotted line in FIG. 8 corresponds to the circuit configuration of the loop filter for the second-order PLL. Accordingly, as an embodiment of the invention, a loop filter having a circuit configuration shown in FIG. 9 is proposed in view of the above.

Figure 9:
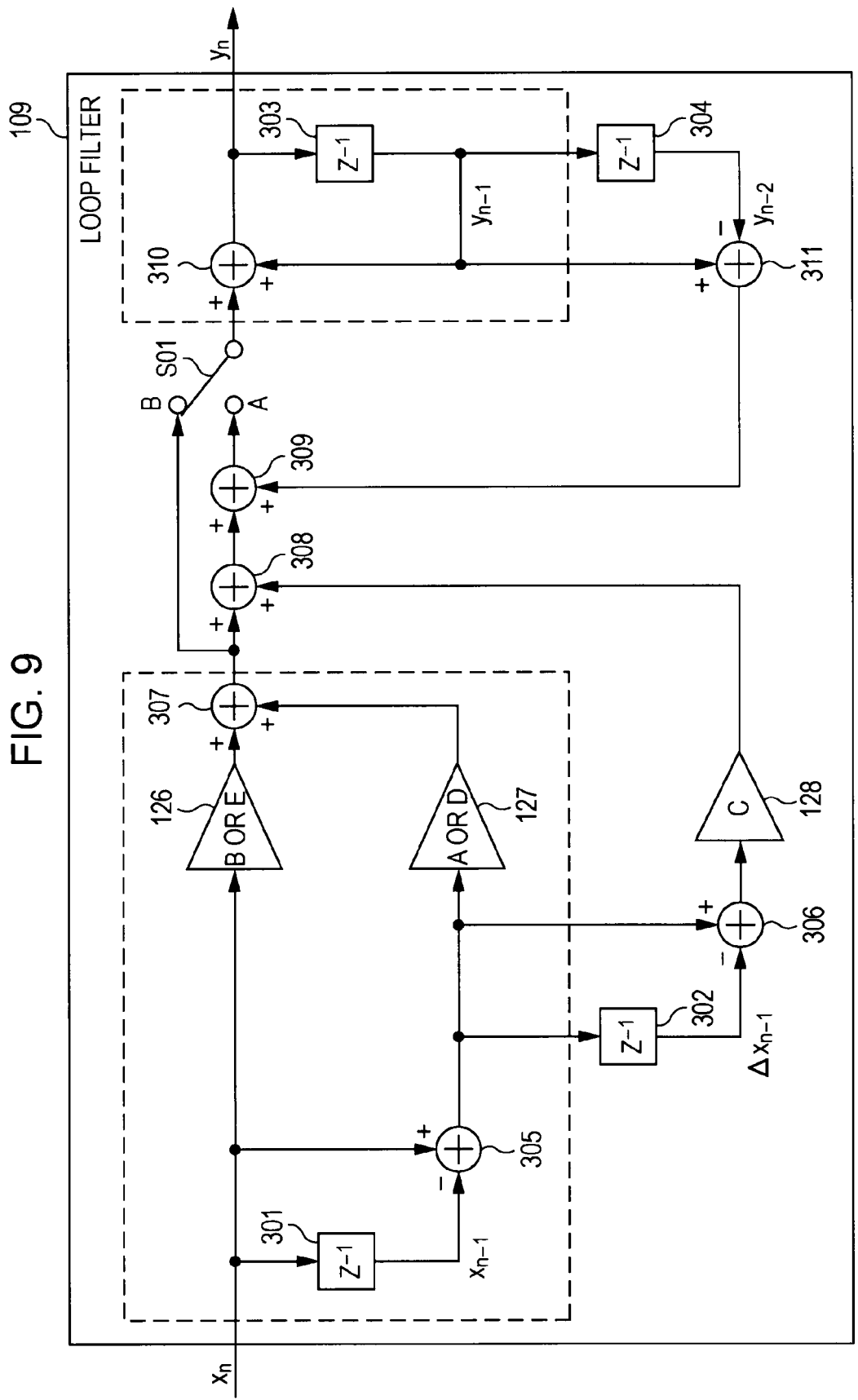
FIG. 9 is an explanatory diagram illustrating an example of a circuit configuration of a loop filter according to the embodiment of the invention.

FIG. 9 is an explanatory diagram illustrating the circuit configuration of the loop filter 109 according to the embodiment of the invention. As shown in FIG. 9, the loop filter 109 according to the embodiment of the invention includes delay elements 301 to 304 constituted by storage elements such as registers and RAMs, adders 305 to 311, multipliers 126 to 128, and switches S01.

The delay element 301 and the adder 305 are components for obtaining $\Delta x_n$ in Numerical Expression 1 and Numerical Expression 2. Specifically, the delay element 301 retains $x_{n-1}$, and the adder 305 subtracts $x_{n-1}$, which is retained in the delay element 301, from $x_n$, thereby obtaining $\Delta x_n$.

Further, the delay element 302 and the adder 306 are components for obtaining $\delta x_n$ in Numerical Expression 2. Specifically, the delay element 302 retains $\Delta x_{n-1}$, and the adder 306 subtracts $\Delta x_{n-1}$, which is retained in the delay element 302, from $\Delta x_n$, thereby obtaining $\delta x_n$.

Further, the delay element 303 is a component for obtaining $y_{n-1}$ in Numerical Expression 1 and Numerical Expression 2. Specifically, the delay element 303 retains $y_{n-1}$.

Further, the delay element 304 and the adder 311 are components for obtaining $\Delta y_{n-1}$ in Numerical Expression 2. Specifically, the delay element 304 retains $y_{n-2}$, and the adder 311 subtracts $y_{n-2}$, which is retained in the delay element 304, from $y_{n-1}$, thereby obtaining $\Delta y_{n-1}$.

The multiplier 126 is a component for obtaining $Bx_n$ in Numerical Expression 1 or $Ex_n$ in Numerical Expression 2. Specifically, the multiplier 126 multiplies $x_n$ by the parameter B or E, thereby obtaining $Bx_n$ in Numerical Expression 1 or $Ex_n$ in Numerical Expression 2.

The multiplier 127 is a component for obtaining $A\Delta x_n$ in Numerical Expression 1 or $D\Delta x_n$ in Numerical Expression 2. Specifically, the multiplier 127 multiplies $\Delta x_n$, which is output from the adder 305, by the parameter A or D, thereby obtaining $A\Delta x_n$ in Numerical Expression 1 or $D\Delta x_n$ in Numerical Expression 2.

The multiplier 128 is a component for obtaining $C\delta x_n$ in Numerical Expression 2. Specifically, the multiplier 128 multiplies $\delta x_n$, which is output from the adder 306, by the parameter C, thereby obtaining $C\delta x_n$ in Numerical Expression 2.

Furthermore, these multipliers 126 to 128 may be configured as bit shifters. By using the multipliers 126 to 128, a multiple of 2 to the power of n (n is an integer, and $n \geq 0$) is realized by n-bit left shift. In addition, a multiple of 2 to the power of −n is realized by n-bit right shift. Accordingly, the multipliers 126 to 128 are configured as bit shifters, and thus it is possible to reduce the size of the circuit. However, when the multipliers 126 to 128 are configured as bit shifters, a multiplier factor which can be set is restricted, and thus it is important to inspect the design thereof previously.

The adder 307 adds $A\Delta x_n$ and $Bx_n$ in Numerical Expression 1, and adds $D\Delta x_n$ and $Ex_n$ in Numerical Expression 2.

The adder 308 adds $C\delta x_n$ in Numerical Expression 2 to the added value obtained by allowing the adder 307 to add $D\Delta x_n$ and $Ex_n$.

The adder 309 adds $\Delta y_{n-1}$ obtained by the adder 311 in Numerical Expression 2 to the output from the adder 308.

The adder 310 adds $y_{n-1}$, which is retained in the delay element 303, to the output from the adder 309 when the switch S01 is connected to the adder 309 through the terminal A. On the other hand, the adder 310 adds $y_{n-1}$, which is retained in the delay element 303, to the output from the adder 307 when the switch S01 is connected to the adder 307 through the terminal B.

One end of the switch S01 (switching section) is connected to the adder 310, and the other end thereof is connected to the adder 309 through the terminal A or the adder 307 through the terminal B. Furthermore, the connection between the switch S01 and the terminal A or B to be described later in detail is controlled by the CPU 260 on the basis of the reception intensity of the radio signal and the current state of the receiver 20 such as the acceleration of the receiver 20.

The above-mentioned loop filter 109 is formed by adding the switch S01 and the terminals A and B to the circuit configuration of the loop filter for the third-order PLL shown in FIG. 8. The loop filter 109 is configured so that the entirety of the circuit configuration of the loop filter for the third-order PLL is activated when the switch S01 is connected to the terminal A, and thus can be operated as the loop filter for the third-order PLL. In addition, the loop order of the PLL 254 becomes the third order.

On the other hand, when the switch S01 is connected to the terminal B, only the circuit configuration in the area, which is enclosed by the dotted line, in the circuit configuration shown in FIG. 9 is activated. Here, the circuit configuration in the area enclosed by the dotted line in FIG. 9 corresponds to the circuit configuration of the loop filter for the second-order PLL as shown in FIG. 7. Accordingly, the loop filter 109 is configured so that the entirety of the circuit configuration of the loop filter for the second-order PLL is activated when the switch S01 is connected to the terminal B, and thus can be operated as the loop filter for the second-order PLL. In addition, the loop order of the PLL 254 becomes the second order. Further, regarding the activation, the output from the loop filter 109 depends on the processing in the activated circuit configuration, and does not depend on the inactivated circuit configuration.

Here, the PLL 254 has performance in synchronization holding, that is, tracking in accordance with the loop order. For example, when the loop order of the PLL 254 is 2 (when the switch S01 is connected to the terminal B), the acceleration tracking ability is low, but the resistance to noise is high. On the other hand, when the loop order of the PLL 254 is 3 (when the switch S01 is connected to the terminal A), the acceleration tracking ability is high, but the resistance to noise is low.

Accordingly, by allowing the CPU 260 to switch appropriately connection terminal of the switch S01, it is possible to exhibit advantages of the second-order PLL 254 and the third-order PLL 254. Furthermore, the CPU 260 changes over the parameters multiplied by the multiplier 126 to 128 in conjunction with the changeover of the switch S01. Further, in the embodiment of the invention, the example in which the changeover is performed by software is described, but the changeover may be performed by hardware.

Further, the loop filter 109 according to the embodiment of the invention can be configured to suppress an increase in size of the circuit, as compared with the case where the circuit configurations of the loop filters for the second-order PLL and the third-order PLL are separately combined. Hereinafter, the sizes of the circuit configuration for the second-order PLL, the circuit configuration for the third-order PLL, the circuit configuration in which both of the configurations are separately combined, and the circuit configuration according to the embodiment of the invention are compared in detail with each other.

order can be formed to have a size equal to that of the circuit configuration of the loop filter for the third-order PLL. Furthermore, when the circuit configuration for the second-order PLL and the circuit configuration for the third-order PLL are separately combined, a wiring area for connecting both circuit configurations is also necessary. Therefore, according to the embodiment of the invention, an effect that reduces the number of the calculator is obtained.

4. Control Method of Loop Filter

The changeover of the switch S01 in the above-mentioned loop filter 109 is controlled by the CPU 260 in accordance with the current state of the receiver 20. Hereinafter, the control method of the loop filter 109 performed by the CPU 260 will be described in detail.

4-1. First Example

In the first example, the CPU 260 controls the changeover of the switch S01 on the basis of the signal intensity of the reception signal transmitted from the artificial satellite 10. Hereinafter, the control method according to the first example will be described with reference to FIG. 10.

Figure 10:
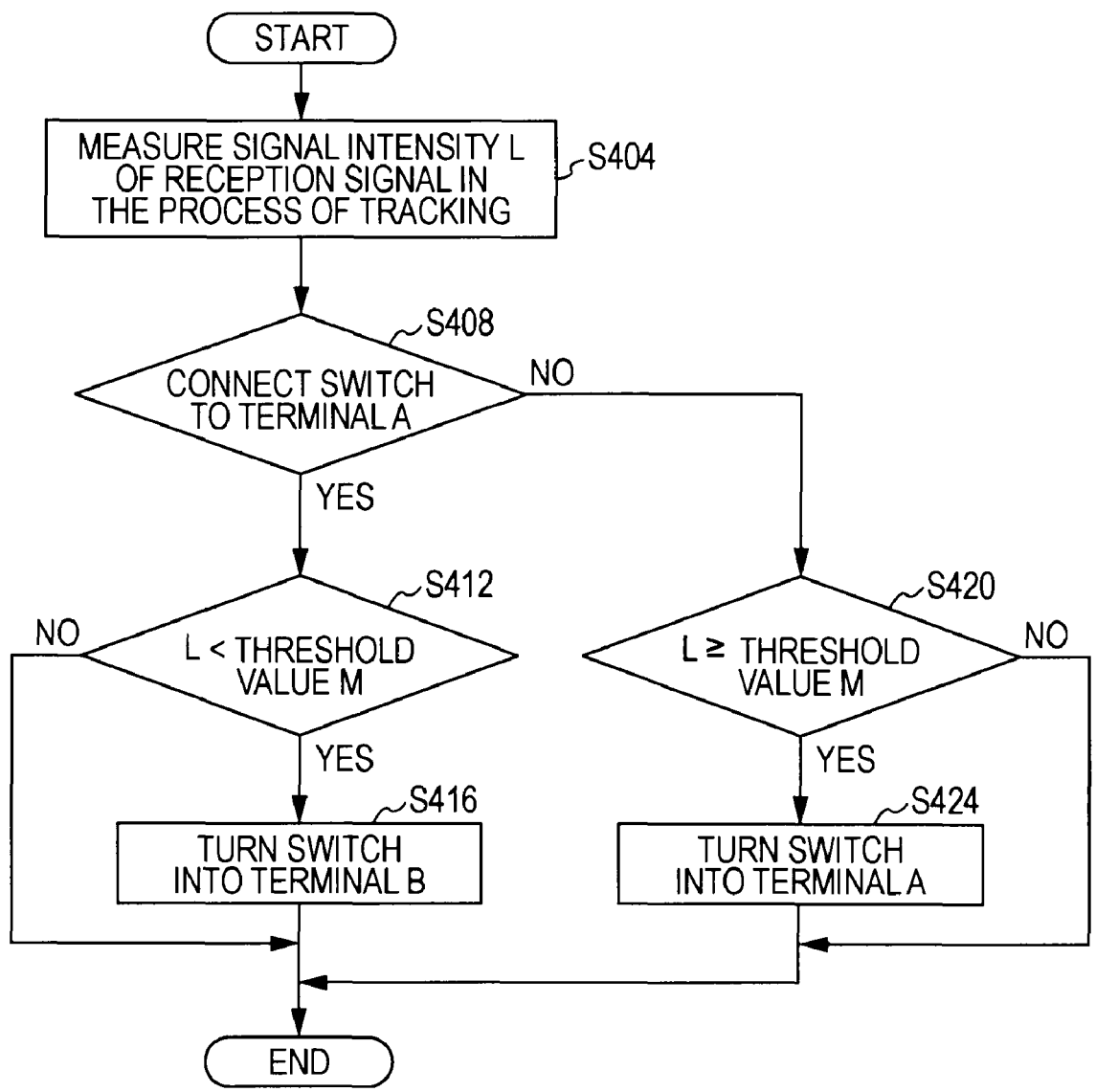
FIG. 10 is a flowchart illustrating a flow of a control method according to a first example of the loop filter.

FIG. 10 is a flowchart illustrating a flow of the control method according to the first example of the loop filter 109. As shown in FIG. 10, first, the signal intensity L of the reception signal in the process of tracking is measured (S404). Here, the measurement of the signal intensity L corresponds to, for example, the processing in the LPF 106. That is, in the embodiment of the invention, the output from the LPF 106 may be treated as the signal intensity L of the reception signal, and the average value of the output from the LPF 106 may be treated as the signal intensity L of the reception signal. Furthermore, according to the embodiment of the invention, the average value of the square sum of the output (I component) from the LPF 106 and the output (Q component) from the LPF 107 may be treated as the signal intensity L of the reception signal.

Thereafter, when the switch S01 is connected to the terminal A in the loop filter 109 and the loop order of the PLL 254 is the third order (S408), the CPU 260 determines whether or not the signal intensity L is less than a threshold value M (S412). Then, when the signal intensity L is less than the threshold value M, the CPU 260 changes the connection place of the switch S01 to the terminal B, thereby changing the loop order of the PLL 254 into the second order (S416).

Furthermore, the threshold value M is stored in the ROM of the memory 270. The CPU 260 copies the threshold value M, which is stored in the ROM at the time of activation, to a

TABLE 1

| | DELAY ELEMENT | MULTIPLIER | ADDER |
|---|---|---|---|
| CIRCUIT CONFIGURATION FOR SECOND-ORDER PLL | 2 | 2 | 3 |
| CIRCUIT CONFIGURATION FOR THIRD-ORDER PLL | 4 | 3 | 7 |
| CIRCUIT CONFIGURATION OF SEPARATE COMBINATION | 6 | 5 | 10 |
| CIRCUIT CONFIGURATION ACCORDING THE EMBODIMENT | 4 | 3 | 7 |

As shown in the table, according to the embodiment of the invention, the loop filter 109 capable of switching the loop order of the PLL 254 between the second order and the third specific area of the RAM of the memory 270, thereby referring to the specific area at the time of comparing the signal intensity L with the threshold value M. Further, the CPU 260 is able to change dynamically the threshold value M in the process of the tracking operation.

On the other hand, when the switch S01 is connected to the terminal B in the loop filter 109 and the loop order of the PLL 254 is the second order (S408), the CPU 260 determines whether or not the signal intensity L is the threshold value M or more (S420). Then, when the signal intensity L is the threshold value M or more, the CPU 260 changes the connection place of the switch S01 to the terminal A, thereby changing the loop order of the PLL 254 into the third order (S424).

Furthermore, the CPU 260 may compare the signal intensity L shown in the above-mentioned steps S412 or S420 with the threshold value M at a predetermined interval of 1 msec or 20 msec.

As described above, when the signal intensity L is the threshold value M or more, the PLL 254 performs the synchronization holding using the third-order PLL on the basis of the control performed by the CPU 260. Therefore, it is possible to improve the acceleration tracking ability. On the other hand, the signal intensity L is less than the threshold value M, the PLL 254 performs the synchronization holding using the second-order PLL on the basis of the control performed by the CPU 260. Therefore, it is possible to improve the receiver sensitivity.

Furthermore, as the threshold value M increase, a rate of operation of the PLL 254 as the third-order PLL increases, and a rate of operation of the PLL 254 as the second-order PLL increases. Therefore, it becomes difficult to improve the acceleration tracking ability. On the other hand, when the threshold value M is set to be excessively low, the tracking is likely to fail because of the effect of the noise while the PLL 254 is operated as the third-order PLL. Accordingly, it is effective that the threshold value M is set to be as low as possible in the range of the signal intensity in which the PLL 254 operated as the third-order PLL is able to perform the tracking.

4-2. Second Example

In the second example, the CPU 260 controls the changeover of the switch S01 on the basis of the acceleration of the receiver 20 measured by the acceleration sensor 280. Hereinafter, the control method according to the second example will be described with reference to FIG. 11.

Figure 11:
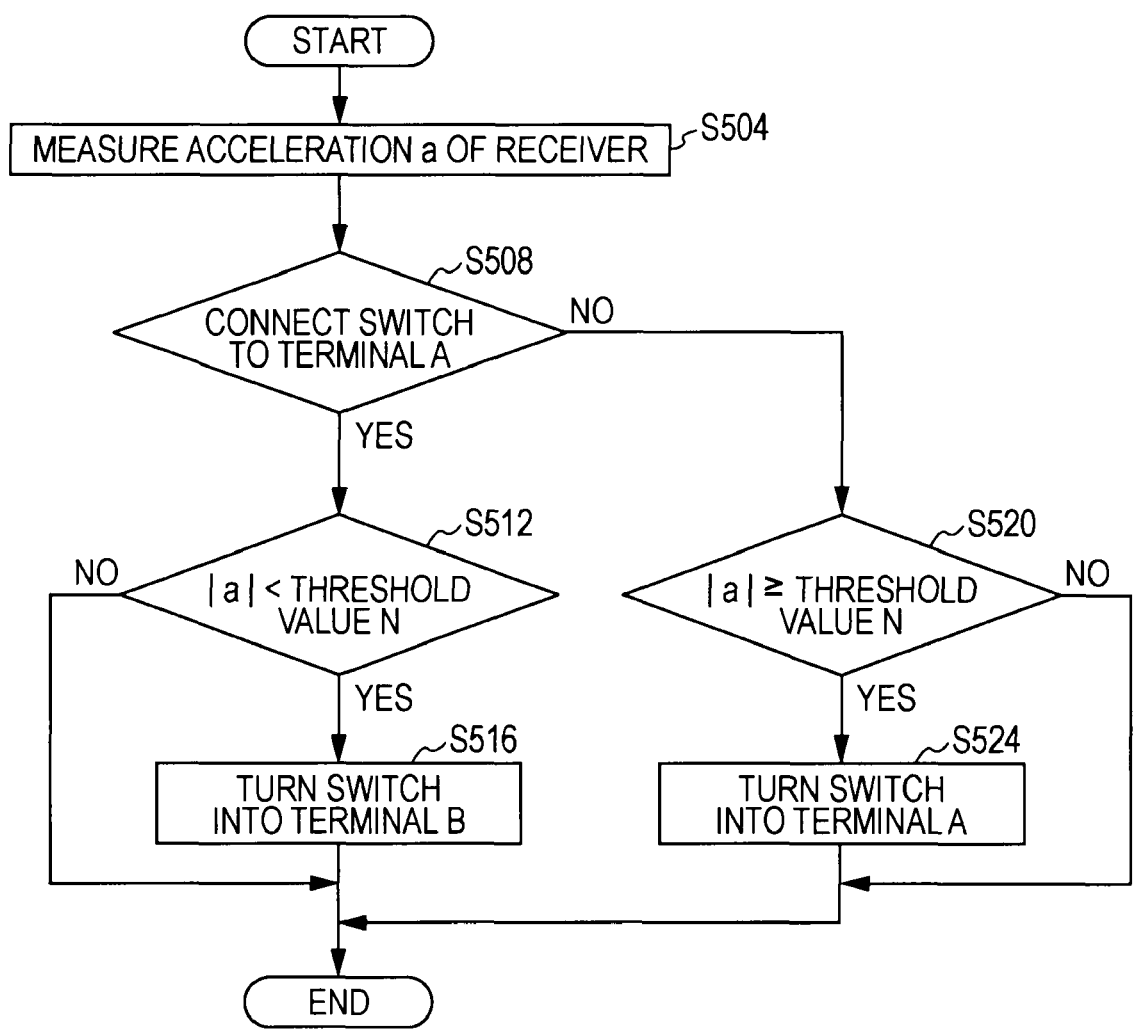
FIG. 11 is a flowchart illustrating a flow of a control method according to a second example of the loop filter.

FIG. 11 is a flowchart illustrating a flow of the control method according to the second example of the loop filter 109. As shown in FIG. 11, first, the acceleration a of the receiver 20 is measured by the acceleration sensor 280 (S504). Furthermore the average value of the acceleration measured by the acceleration sensor 280 is treated as the acceleration a.

Thereafter, when the switch S01 is connected to the terminal A in the loop filter 109 and the loop order of the PLL 254 is the third order (S508), the CPU 260 determines whether or not the absolute value of the acceleration a is less than a threshold value N (S512). Then, when the absolute value of the acceleration a is less than the threshold value N, the CPU 260 changes the connection place of the switch S01 to the terminal B, thereby changing the loop order of the PLL 254 into the second order (S516).

Furthermore, the threshold value N is stored in the ROM of the memory 270. The CPU 260 copies the threshold value N, which is stored in the ROM at the time of activation, to a specific area of the RAM of the memory 270, thereby referring to the specific area at the time of comparing the absolute value of the acceleration a with the threshold value N. Further, the CPU 260 is able to change dynamically the threshold value N in the process of the tracking operation.

On the other hand, when the switch S01 is connected to the terminal B in the loop filter 109 and the loop order of the PLL 254 is the second order (S508), the CPU 260 determines whether or not the absolute value of the acceleration a is the threshold value N or more (S520). Then, when the absolute value of the acceleration a is the threshold value N or more, the CPU 260 changes the connection place of the switch S01 to the terminal A, thereby changing the loop order of the PLL 254 into the third order (S524).

Furthermore, the CPU 260 may compare the absolute value of the acceleration a shown in the above-mentioned steps S512 or S520 with the threshold value N at a predetermined interval of 1 msec or 20 msec.

As described above, when the absolute value of the acceleration a is the threshold value N or more, the PLL 254 performs the synchronization holding using the third-order PLL on the basis of the control performed by the CPU 260. Therefore, it is possible to improve the acceleration tracking ability. More specifically, a vehicle equipped with the receiver 20 enters the curve, an increase in the acceleration a changes the order of the PLL 254 to the third order, and thus it is expected to improve the acceleration tracking ability. On the other hand, the absolute value of the acceleration a is less than the threshold value N, the PLL 254 performs the synchronization holding using the second-order PLL on the basis of the control performed by the CPU 260. Therefore, it is possible to improve the receiver sensitivity.

Furthermore, as the threshold value N increase, a rate of operation of the PLL 254 as the third-order PLL increases, and a rate of operation of the PLL 254 as the second-order PLL increases. Therefore, it becomes difficult to improve the acceleration tracking ability. On the other hand, when the threshold value N is set to be excessively low, the tracking is likely to fail because of the effect of the noise while the PLL 254 is operated as the third-order PLL. Accordingly, it is effective that the threshold value N is set to be as low as possible in the range of the acceleration a in which the PLL 254 operated as the third-order PLL is able to perform the tracking.

5. Conclusion

As described above, according to the embodiment of the invention, by changing the loop order of the PLL 254 in accordance with the current state of the receiver 20, it is possible to exhibit advantages of the second-order PLL and the third-order PLL. For example, when the signal intensity L is the threshold value M or more, the PLL 254 performs the synchronization holding using the third-order PLL on the basis of the control performed by the CPU 260. Therefore, it is possible to improve the acceleration tracking ability. On the other hand, the signal intensity L is less than the threshold value M, the PLL 254 performs the synchronization holding using the second-order PLL on the basis of the control performed by the CPU 260. Therefore, it is possible to improve the receiver sensitivity.

Further, according to the embodiment of the invention, the loop filter 109 capable of switching the loop order of the PLL 254 between the second order and the third order can be formed to have a size equal to that of the circuit configuration of the loop filter for the third-order PLL. Furthermore, when the circuit configuration for the second-order PLL and the circuit configuration for the third-order PLL are separately combined, a wiring area for connecting both circuit configurations is also necessary. Therefore, according to the embodiment of the invention, the effect that reduces the number of the calculator is obtained. Furthermore, according to the embodiment of the invention, it is possible to reduce power consumption.

Further, according to the embodiment of the invention, as a high acceleration tracking ability becomes unnecessary for a locale, the acceleration of the apparatus equipped with the receiver 20 may be set to be low, and the threshold value M or N may be set to be high. As a result, since the PLL 254 is often operated as the second-order PLL, it is possible to exhibit the stability which is an advantage of the second-order PLL.

On the other hand, as consideration of the synchronization holding under a weak signal becomes unnecessary for a locale, or as it becomes unnecessary to consider the synchronization holding under a weak signal in the apparatus equipped with the receiver 20, the threshold value M or N may be set to be low. As a result, since the PLL 254 is often operated as the third-order PLL, it is possible to exhibit the acceleration tracking ability which is an advantage of the third-order PLL.

The preferred embodiments of the invention were hitherto described with reference to the appended drawings, but the invention is not limited to the above-mentioned examples. It will be readily apparent to those skilled in the art that obvious modifications, derivations, and variations can be made without departing from the technical scope described in the claims appended hereto. In addition, it should be understood that such modifications, derivations, and variations belong to the technical scope of the invention.

For example, it is not always necessary for the steps in the processing of the receiver 20 in the description to proceed chronologically in the order described as the flowchart. For example, the steps in the processing of the receiver 20 may include the processing (for example, parallel processing or processing performed by an object) performed separately or in parallel.

Further, the description gives examples of changing the loop order of the PLL 254 into the second order and the third order, but the invention is not limited to the examples. For example, the circuit configuration for the m-th order PLL including the circuit configuration for the n-th order PLL (m>n) is provided in the loop filter 109, and the which circuit configuration is activated is changed by the switch S01, and thereby it is possible to change the loop order of the PLL 254 between the n-th order and m-th order.

Further, the above description gives an example of using the signal intensity L or the acceleration a in the change of the loop order of the PLL 254, but the invention is not limited to the example. For example, both of the signal intensity L and acceleration a may be used in the change of the loop order of the PLL 254 in a combined manner.

The present application contains subject matter related to that disclosed in Japanese Priority Patent Application JP 2009-089395 filed in the Japan Patent Office on Apr. 1, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A communication system comprising:
    a phase-locked loop that maintains synchronization of a reception signal, wherein the phase-locked loop includes
        a loop filter that has a circuit configuration m for an m-th order phase-locked loop including a circuit configuration n for an n-th order phase-locked loop (m>n), and
        a switching section that switches circuit configurations, which are activated in the loop filter, between the circuit configuration n and the circuit configuration m; and
    a control section that controls the switching section to switch the circuit configurations in response to change in a current state of the communication system,
    wherein the control section
        compares a threshold value with a value which is obtained on the basis of signal intensity measurement of the reception signal,
        controls the switching section to switch the circuit configurations, which are activated in the loop filter, from the circuit configuration n to the circuit configuration m when the value is equal to or greater than the threshold value, and
        controls the switching section to switch the circuit configurations, which are activated in the loop filter, from the circuit configuration m to the circuit configuration n when the value is less than the threshold value.

2. The communication system according to claim 1, wherein the control section periodically compares the threshold value with the value which is obtained on the basis of the signal intensity measurement of the reception signal.

3. A communication system comprising:
    a phase-locked loop that maintains synchronization of a reception signal, wherein the phase-locked loop includes
        a loop filter that has a circuit configuration m for an m-th order phase-locked loop including a circuit configuration n for an n-th order phase-locked loop (m>n), and
        a switching section that switches circuit configurations, which are activated in the loop filter, between the circuit configuration n and the circuit configuration m; and
    a control section that controls the switching section to switch the circuit configurations in response to change in a current state of the communication system,
    wherein the control section
        compares a threshold value with a value which is obtained on the basis of acceleration measurement of the communication system,
        controls the switching section to switch the circuit configurations, which are activated in the loop filter, from the circuit configuration m to the circuit configuration n when the value is equal to or greater than the threshold value, and
        controls the switching section to switch the circuit configurations, which are activated in the loop filter, from the circuit configuration n to the circuit configuration m when the value is less than the threshold value.

4. The communication system according to claim 3, wherein the control section periodically compares the threshold value with the value which is obtained on the basis of the acceleration measurement of the communication system.

5. A movable body equipped with a communication system comprising:
    a phase-locked loop that maintains synchronization of a reception signal, wherein the phase-locked loop includes a loop filter that has a circuit configuration m for an m-th order phase-locked loop including a circuit configuration n for an n-th order phase-locked loop (m>n), and a switching section that switches circuit configurations, which are activated in the loop filter, between the circuit configuration n and the circuit configuration m; and a control section that controls the switching section to switch the circuit configurations in response to change in a current state of the communication system, wherein the control section compares a threshold value with a value which is obtained on the basis of signal intensity measurement of the reception signal, controls the switching section to switch the circuit configurations, which are activated in the loop filter, from the circuit configuration n to the circuit configuration m when the value is equal to or greater than the threshold value, and controls the switching section to switch the circuit configurations, which are activated in the loop filter, from the circuit configuration m to the circuit configuration n when the value is less than the threshold value.

6. A communication method in a loop filter that is included in a phase-locked loop for maintaining synchronization of a reception signal and has a circuit configuration m for an m-th order phase-locked loop including a circuit configuration n for an n-th order phase-locked loop (m>n), the method comprising:

comparing a threshold value with a value that is obtained on the basis of signal intensity measurement of the reception signal;

switching the circuit configurations, which are activated in the loop filter, from the circuit configuration n to the circuit configuration m when the value is equal to or greater than the threshold value; and switching the circuit configurations, which are activated in the loop filter, from the circuit configuration m to the circuit configuration n when the value is less than the threshold value.

* * * * *